(12) United States Patent
Kato et al.

(10) Patent No.: US 8,471,459 B2
(45) Date of Patent: *Jun. 25, 2013

(54) FLUORESCENT SUBSTANCE AND LIGHT-EMITTING DEVICE EMPLOYING THE SAME

(75) Inventors: Masahiro Kato, Kanagawa-Ken (JP); Yumi Fukuda, Tokyo (JP); Aoi Okada, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/218,808

(22) Filed: Aug. 26, 2011

(65) Prior Publication Data

US 2012/0056528 A1    Mar. 8, 2012

(30) Foreign Application Priority Data

| Sep. 2, 2010 | (JP) | 2010-196532 |
| Feb. 25, 2011 | (JP) | 2011-039988 |
| Aug. 23, 2011 | (JP) | 2011-181831 |

(51) Int. Cl.
  *H01J 1/63* (2006.01)
  *C04B 35/64* (2006.01)

(52) U.S. Cl.
  USPC .............. 313/503; 313/498; 313/500; 445/24

(58) Field of Classification Search
  CPC ............ C04B 14/00; C04B 22/00; H01L 33/15
  IPC .... C04B 14/00,22/00; H01L 33/15; H04B 1/03
  See application file for complete search history.

(56) References Cited

U.S. PATENT DOCUMENTS

| 8,084,942 B2* | 12/2011 | Hanamoto et al. ............ 313/512 |
| 2009/0072195 A1 | 3/2009 | Fukuda et al. |
| 2009/0096361 A1 | 4/2009 | Fukuda et al. |
| 2010/0102707 A1* | 4/2010 | Fukuda et al. ................ 313/503 |
| 2011/0057149 A1* | 3/2011 | Fukuda et al. ......... 252/301.6 R |
| 2011/0058582 A1* | 3/2011 | Fukuda et al. ............. 372/44.01 |

(Continued)

FOREIGN PATENT DOCUMENTS

| EP | 2 368 965 A2 | 9/2011 |
| EP | 2 368 965 A3 | 9/2011 |

(Continued)

OTHER PUBLICATIONS

"Space-group symmetry", International Tables for Crystallography, vol. A, 5th Edition, Mar. 31, 2002, pp. 206-207.

(Continued)

*Primary Examiner* — Tracie Y Green
(74) *Attorney, Agent, or Firm* — Oblon, Spivak, McClelland, Maier & Neustadt, L.L.P.

(57) ABSTRACT

The fluorescent substance according to the embodiment is generally represented by $(M_{1-x}EC_x)_a Si_b AlO_c N_d$, and is a kind of the $Sr_2Si_7Al_3ON_{13}$ phosphors. The substance is in the form of crystals having a mean grain size of 20 to 100 μm, and the aspect ratio thereof is in the range of 2 to 4. This substance emits luminescence having a peak in the wavelength range of 580 to 660 nm when excited by light of 250 to 500 nm. The embodiment also provides a light-emitting device comprising this substance in combination with a light-emitting element and a green light-emitting fluorescent substance.

17 Claims, 13 Drawing Sheets

U.S. PATENT DOCUMENTS

| | | | |
|---|---|---|---|
| 2011/0058583 A1* | 3/2011 | Fukuda et al. | 372/44.01 |
| 2011/0220919 A1 | 9/2011 | Okada et al. | |
| 2012/0043573 A1* | 2/2012 | Mitsuishi et al. | 257/98 |
| 2012/0049115 A1 | 3/2012 | Matsuda et al. | |
| 2012/0056209 A1* | 3/2012 | Mitsuishi et al. | 257/88 |
| 2012/0056216 A1* | 3/2012 | Mitsuishi et al. | 257/89 |
| 2012/0056225 A1* | 3/2012 | Mitsuishi et al. | 257/98 |
| 2012/0056528 A1* | 3/2012 | Kato et al. | 313/503 |
| 2012/0062103 A1* | 3/2012 | Okada et al. | 313/483 |
| 2012/0062106 A1* | 3/2012 | Okada et al. | 313/503 |

FOREIGN PATENT DOCUMENTS

| | | |
|---|---|---|
| EP | 2 423 293 A2 | 2/2012 |
| JP | 2002-531955 | 9/2002 |
| JP | 2004-115633 | 4/2004 |
| JP | 2004-516688 | 6/2004 |
| JP | 2004-520916 | 7/2004 |
| JP | 2009-76656 A | 4/2009 |
| JP | 2009-286995 A | 12/2009 |
| JP | 2010-106127 A | 5/2010 |
| WO | WO 2009/008250 A1 | 1/2009 |
| WO | WO 2010/087348 A1 | 8/2010 |

OTHER PUBLICATIONS

Japanese Office Action Issued Jul. 6, 2012 in Patent Application No. 2011-181831 (with English translation).

Office Action issued Nov. 20, 2012, in Korean Patent Application No. 10-2011-0088512 with English translation.

Extended European Search Report issued May 30, 2012 in Patent Application No. 11179423.6.

* cited by examiner

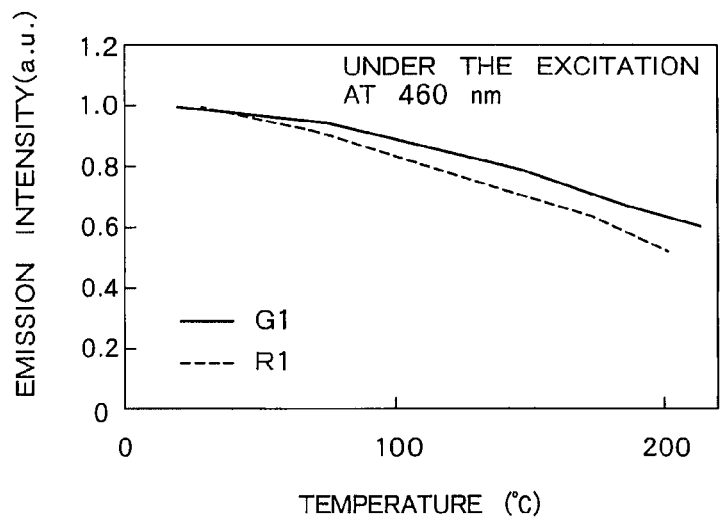
F I G. 3
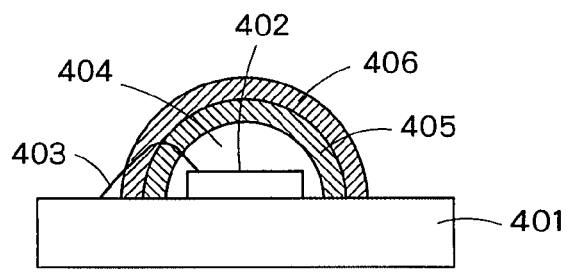
F I G. 4
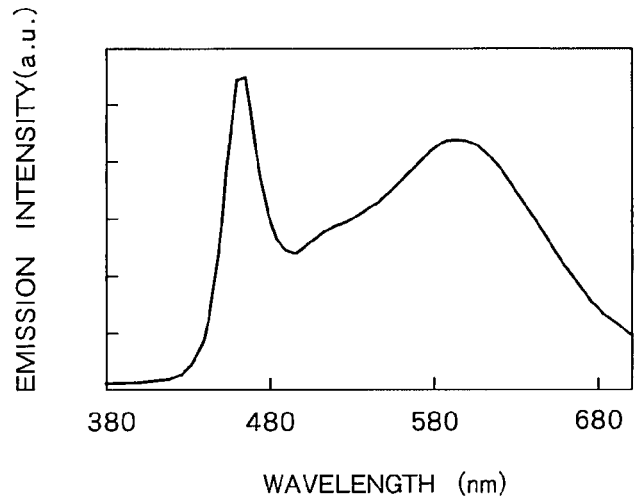
F I G. 5

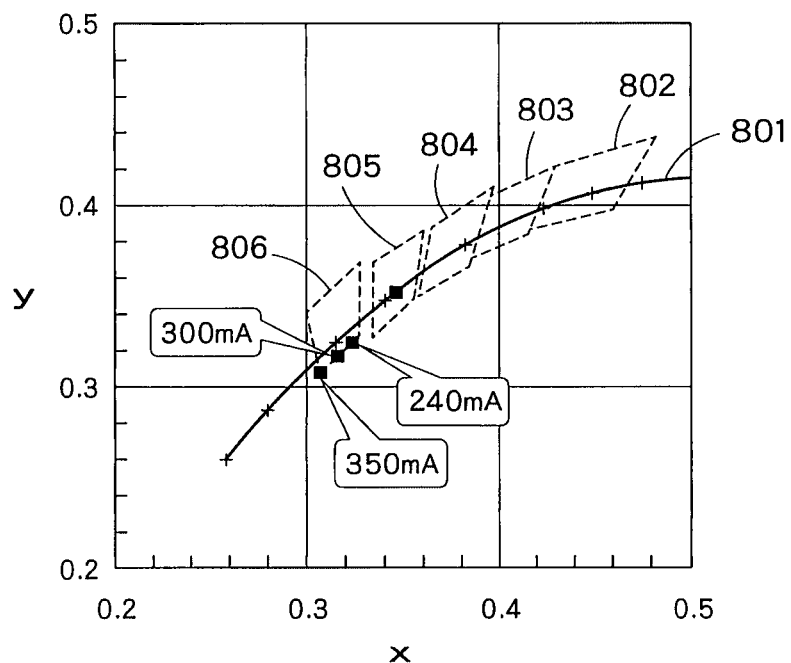
F I G. 6
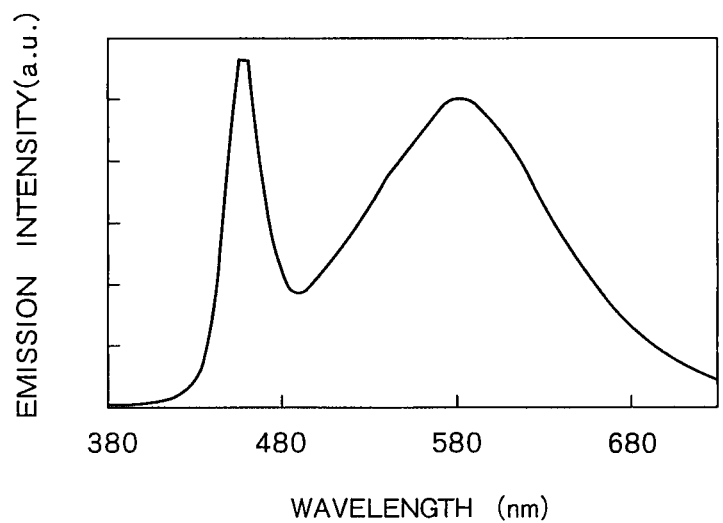
F I G. 7

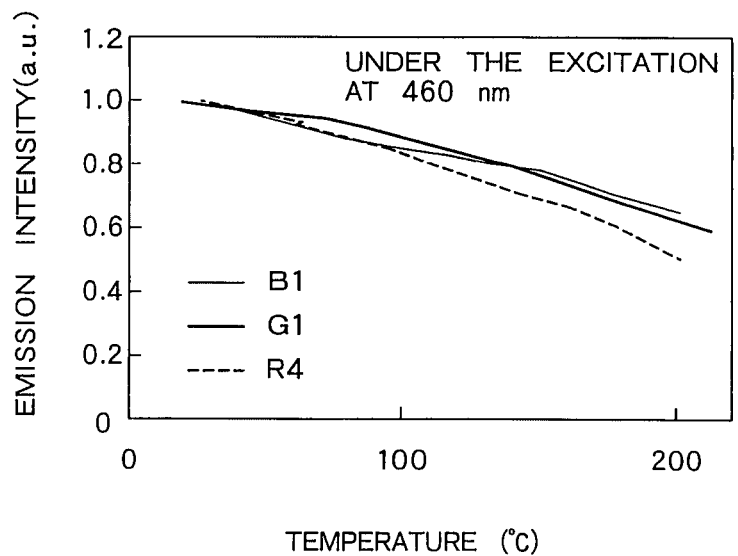
F I G. 10
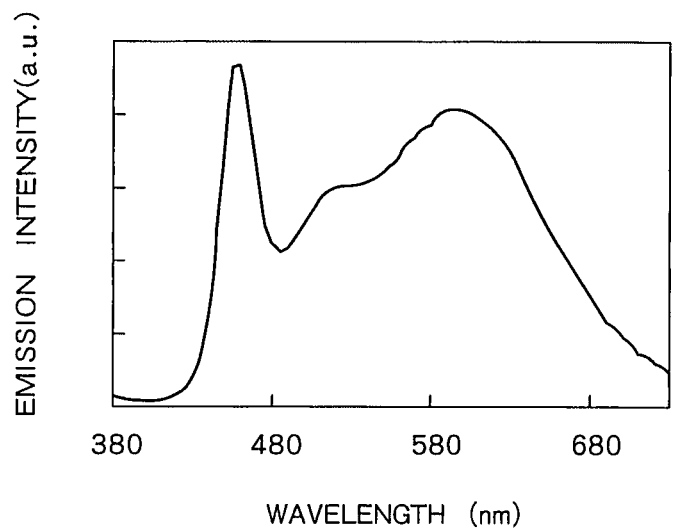
F I G. 11

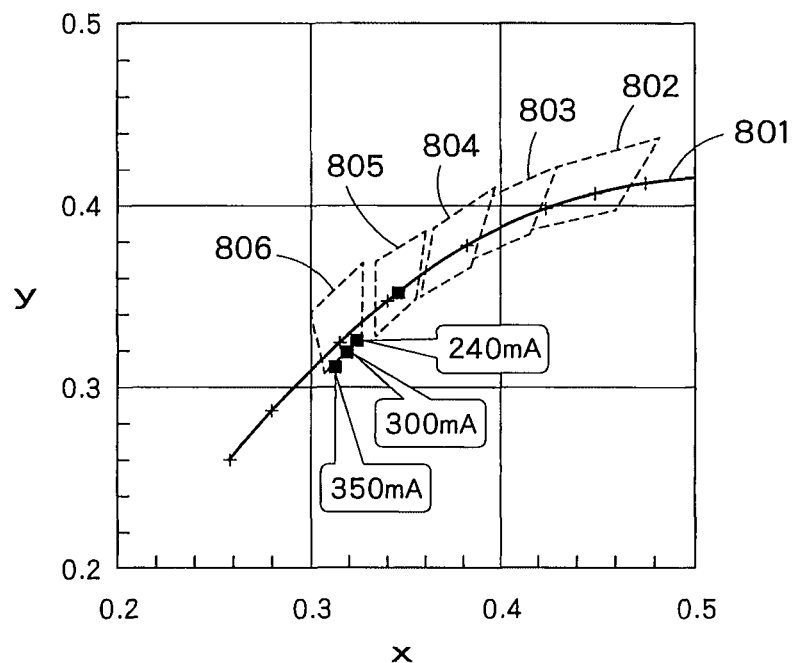
F I G. 12
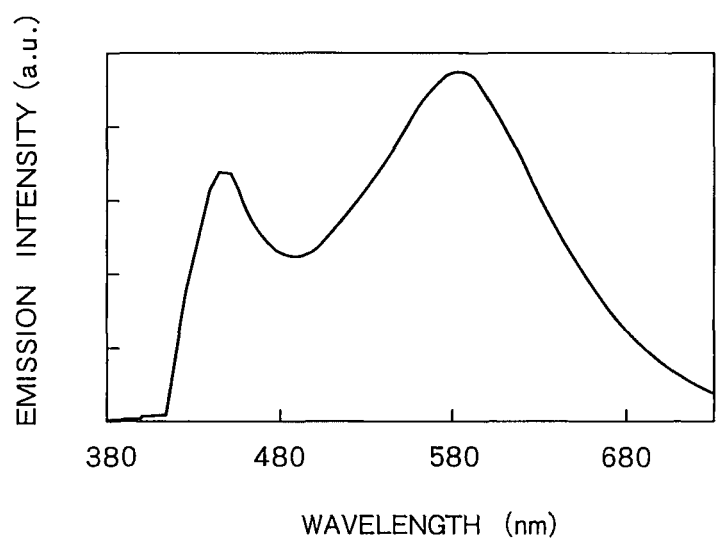
F I G. 13

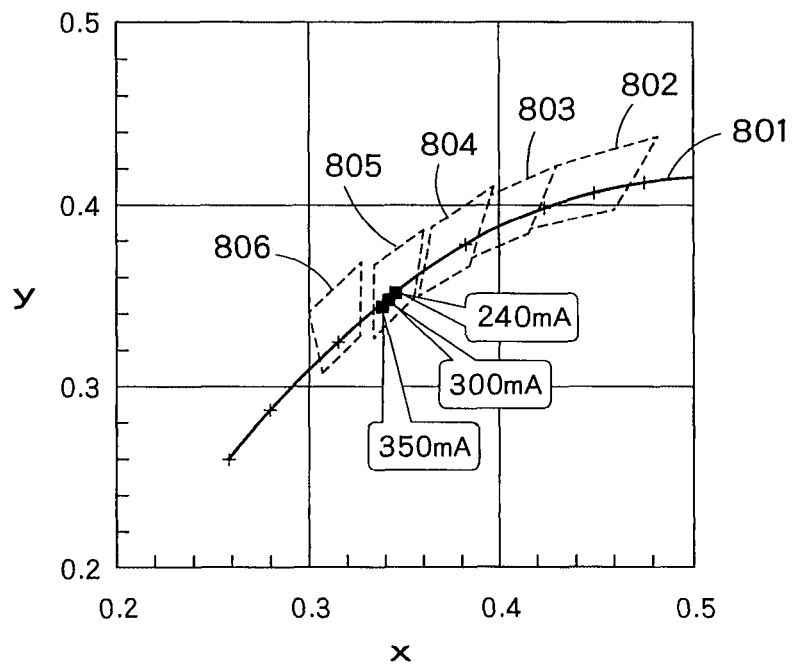
F I G. 14
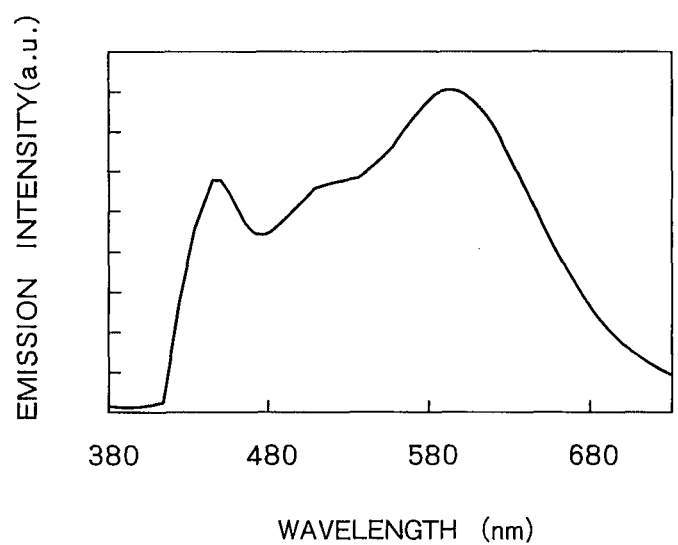
F I G. 15

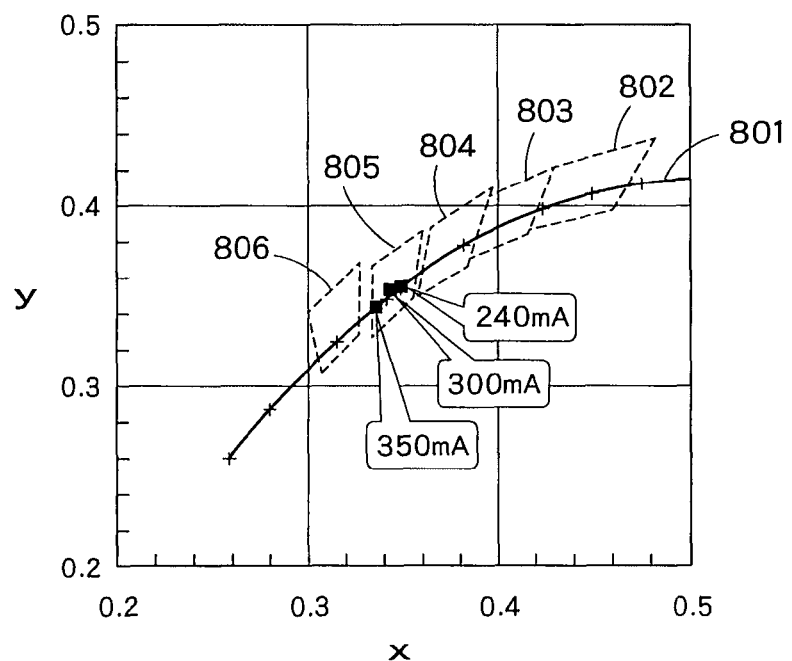
F I G. 16
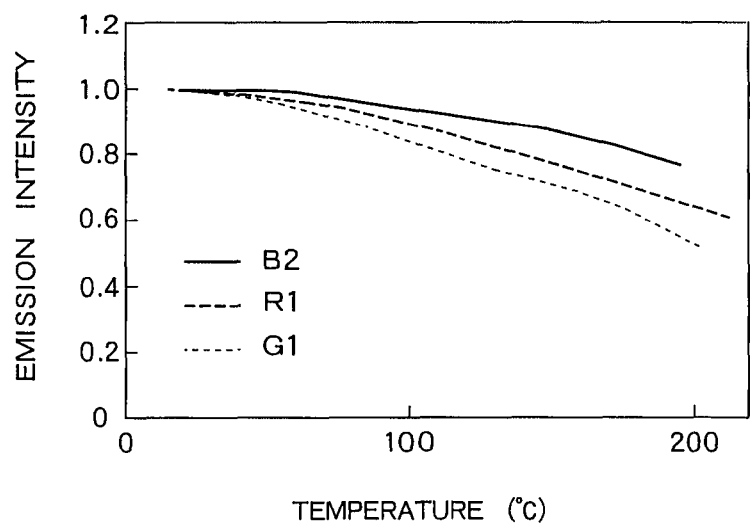
F I G. 17

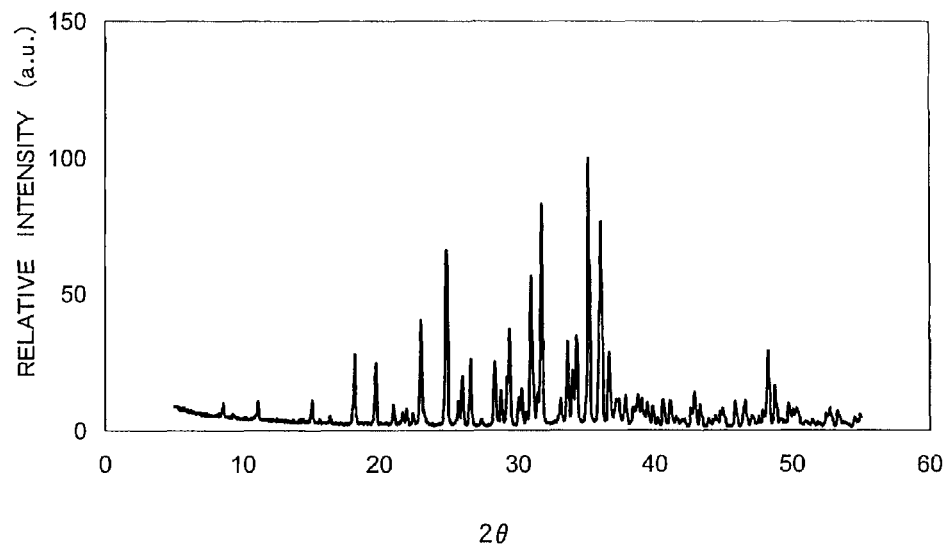
F I G. 18
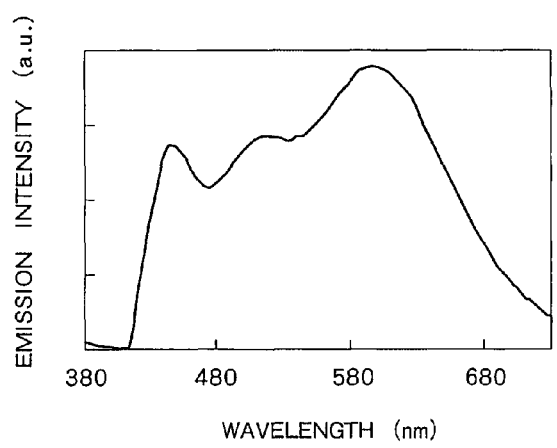
F I G. 19

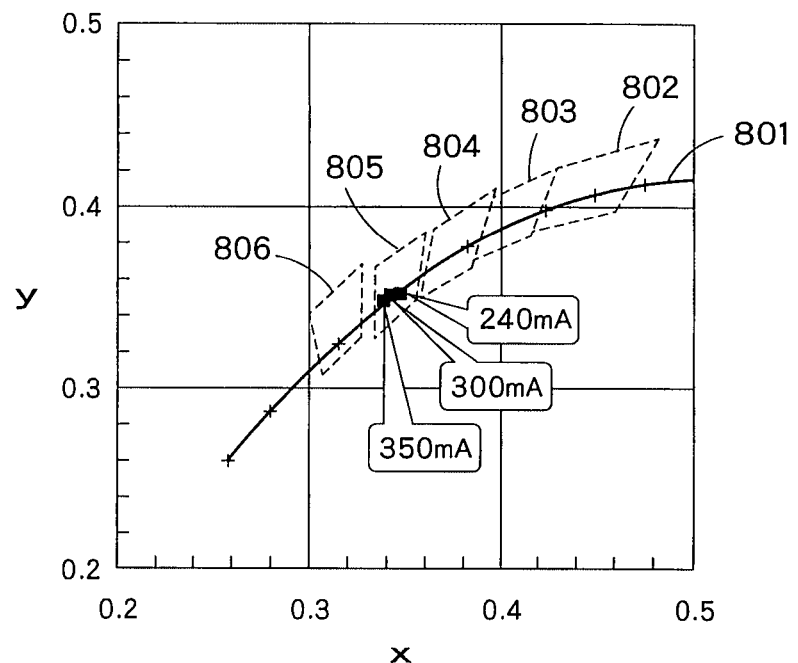
F I G. 20
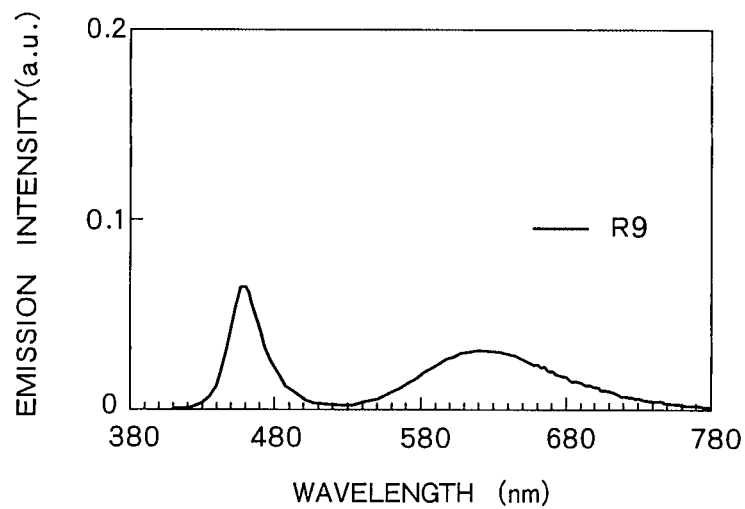
F I G. 21

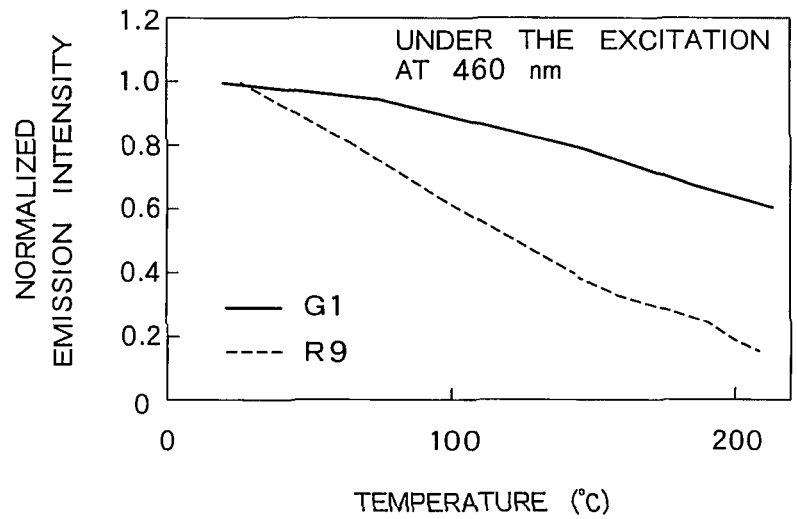
F I G. 22
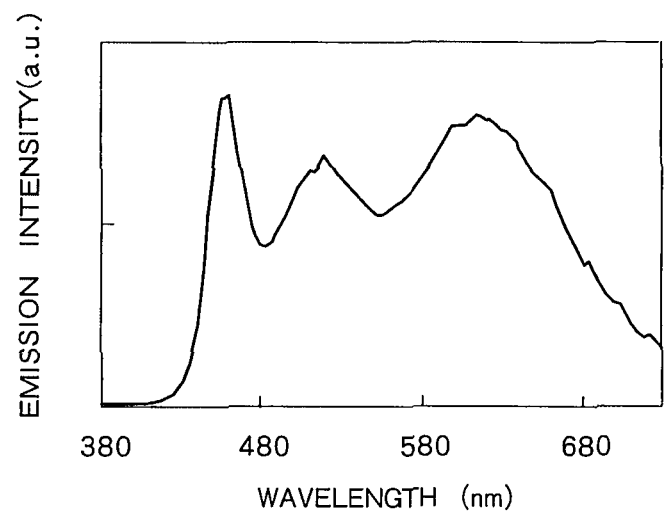
F I G. 23

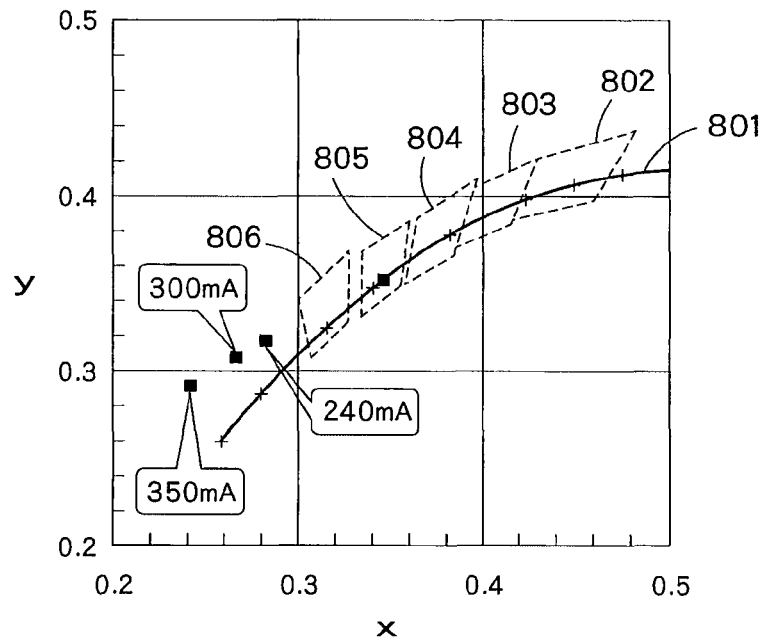
F I G. 24
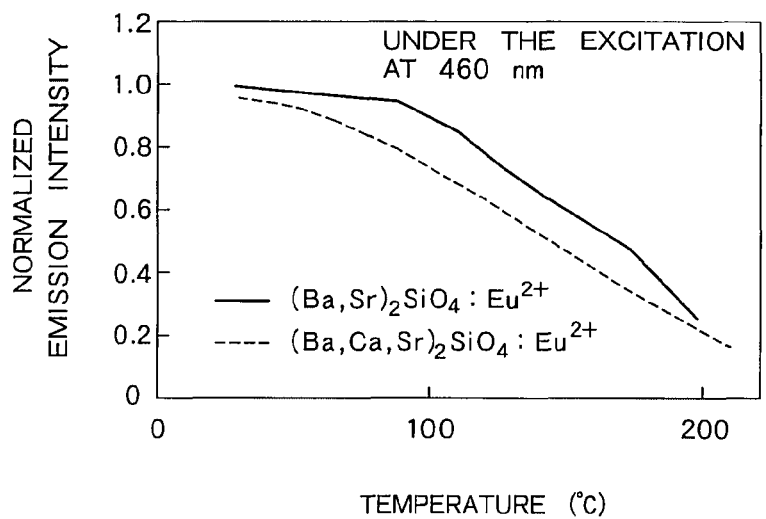
F I G. 25

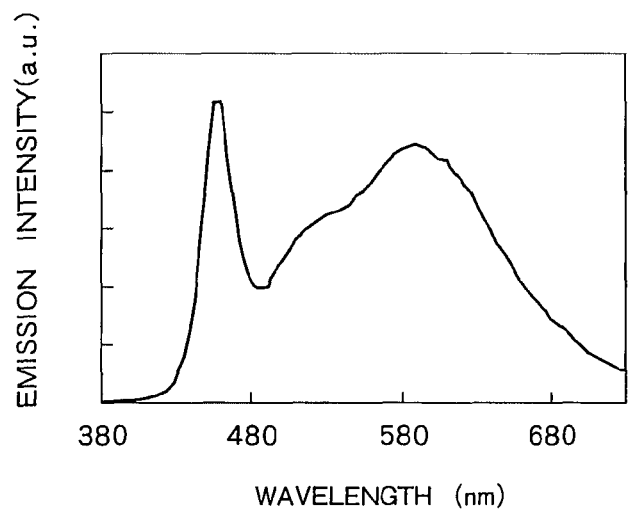
F I G. 26
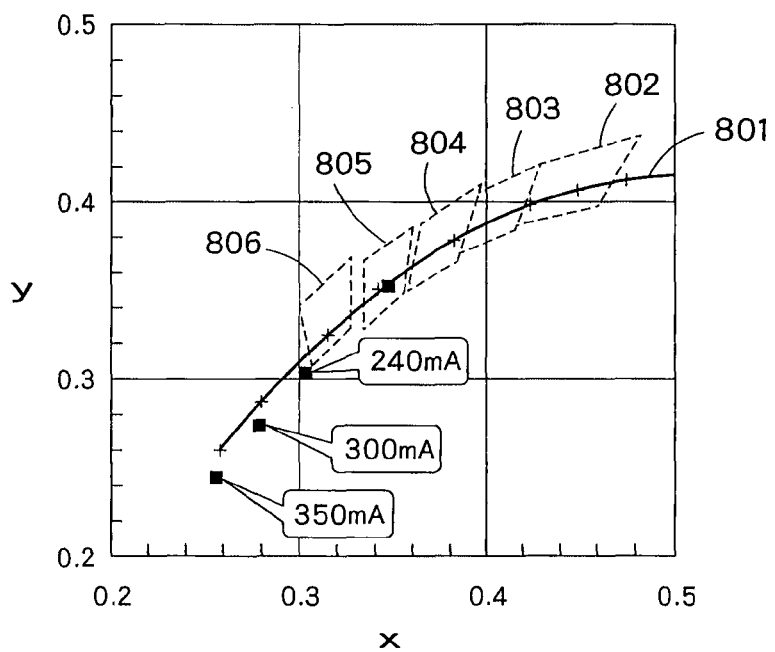
F I G. 27

FLUORESCENT SUBSTANCE AND LIGHT-EMITTING DEVICE EMPLOYING THE SAME

CROSS-REFERENCE TO RELATED APPLICATIONS

This application is based upon and claims the benefit of priority from the prior Japanese Patent Application Nos. 2010-196532, filed on Sep. 2, 2010, 2011-39988, filed on Feb. 25, 2011, and 2011-181831, filed on Aug.23; the entire contents of which are incorporated herein by reference.

FIELD

The embodiments relate to a fluorescent substance excellent in quantum efficiency and a light-emitting device employing that substance.

BACKGROUND

LED light-emitting devices, which utilize light-emitting diodes, are used in many displaying elements of instruments such as mobile devices, PC peripheral equipments, OA equipments, various kinds of switches, light sources for backlighting, and indicating boards. The LED light-emitting devices are strongly required not only to have high efficiencies, but also to be excellent in color rendition when used for general lighting or to deliver wide color gamuts when used for backlighting. In order to enhance the efficiencies of light-emitting devices, it is necessary to improve those of fluorescent substances used therein. In addition, from the viewpoint of realizing high color rendition or a wide color gamut, it is preferred to adopt a white light-emitting device that comprises a combination of a blue light-emitting excitation source, a fluorescent substance emitting green luminescence under excitation by blue light, and another fluorescent substance emitting red luminescence under excitation by blue light.

Meanwhile, high load LED light-emitting devices generate heat in operation so that fluorescent substances used therein are generally heated to about 100° C. to 200° C. When thus heated, the fluorescent substances generally lose emission intensity. Accordingly, it is desired to provide a fluorescent substance less undergoing the decrease of emission intensity (temperature quenching) even if the temperature rises considerably.

Eu-activated alkaline earth orthosilicate phosphors are typical examples of fluorescent substances emitting green or red luminescence under excitation by blue light, and hence are preferably used in the aforementioned LED light-emitting devices. The green light-emitting fluorescent substance of that phosphor shows, for example, luminance characteristics such as an absorption ratio of 73%, an internal quantum efficiency of 85% and a luminous efficiency of 62% under excitation by light at 460 nm; and the red light-emitting one of that phosphor shows, for example, luminance characteristics such as an absorption ratio of 82%, an internal quantum efficiency of 66% and a luminous efficiency of 54% under excitation by light at 460 nm. A LED light-emitting device comprising those in combination gives white light with such a high efficiency and such a high color gamut as to realize 186 lm/W based on the excitation light and a general color rendering index Ra=86, respectively.

However, if those Eu-activated alkaline earth orthosilicate phosphors are used in a high load LED light-emitting device, they often undergo the above-described decrease of emission intensity. Specifically, when the temperature rises, those fluorescent substances remarkably suffer from the temperature quenching but the blue LED is not so affected that the emission intensity thereof decreases only slightly. Consequently, the resultant light radiated from the device is liable to lose the balance between the emission from the blue LED and the luminescence from the fluorescent substances. Further, since the temperature quenching acts in different manners on the green and red light-emitting fluorescent substances, it often becomes difficult to keep the balance between green and red colors in the resultant light in accordance with increase of the load. As a result, there is a problem of serious color discrepancies caused by loss of the balance among the blue, green and red emissions.

BRIEF DESCRIPTION OF THE DRAWINGS

FIG. 3 shows graphs giving temperature characteristics of the fluorescent substances used in Example 1.

FIG. 4 shows a vertical sectional view schematically illustrating a light-emitting device produced in Example 1.

FIG. 5 shows an emission spectrum of the light-emitting device produced in Example 1.

FIG. 6 shows a relation between the chromaticity point (2 degree field of view) and the drive current with regard to the light-emitting device produced in Example 1

FIG. 7 shows an emission spectrum of the light-emitting device produced in Example 2.

FIG. 10 shows graphs giving temperature characteristics of the fluorescent substances used in Example 4.

FIG. 11 shows an emission spectrum of the light-emitting device produced in Example 4.

FIG. 12 shows a relation between the chromaticity point (2 degree field of view) and the drive current with regard to the light-emitting device produced in Example 4.

FIG. 13 shows an emission spectrum of the light-emitting device produced in Example 5.

FIG. 14 shows a relation between the chromaticity point (2 degree field of view) and the drive current with regard to the light-emitting device produced in Example 5.

FIG. 15 shows an emission spectrum of the light-emitting device produced in Example 6.

FIG. 16 shows a relation between the chromaticity point (2 degree field of view) and the drive current with regard to the light-emitting device produced in Example 6.

FIG. 17 shows graphs giving temperature characteristics of the fluorescent substances used in Example 9.

FIG. 18 is an XRD profile of the fluorescent substance produced in Example 1.

FIG. 19 shows an emission spectrum of the light-emitting device produced in Example 9.

FIG. 20 shows a relation between the chromaticity point (2 degree field of view) and the drive current with regard to the light-emitting device produced in Example 9.

FIG. 21 shows an emission spectrum of the red fluorescent substance produced in Comparative Example 1 under excitation by light at 460 nm.

FIG. 22 shows graphs giving temperature characteristics of the fluorescent substances used in Comparative Example 1.

FIG. 23 shows an emission spectrum of the light-emitting device produced in Comparative Example 1.

FIG. 24 shows a relation between the chromaticity point (2 degree field of view) and the drive current with regard to the light-emitting device produced in Comparative Example 1.

FIG. 25 shows graphs giving temperature characteristics of the fluorescent substances used in Comparative Example 2.

FIG. 26 shows an emission spectrum of the light-emitting device produced in Comparative Example 2.

FIG. 27 shows a relation between the chromaticity point (2 degree field of view) and the drive current with regard to the light-emitting device produced in Comparative Example 2.

DETAILED DESCRIPTION

Figure 1:
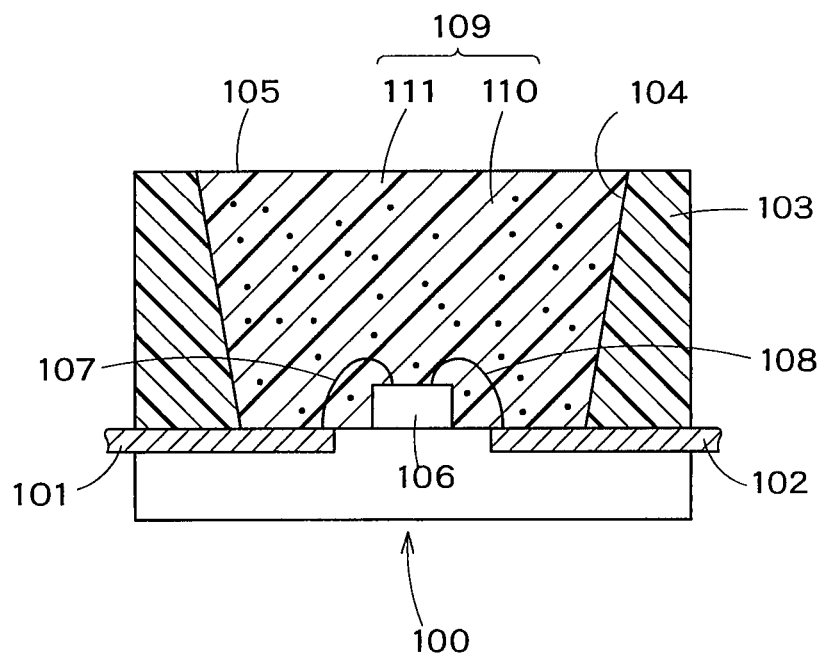
FIG. 1 shows a vertical sectional view schematically illustrating a light-emitting device utilizing a fluorescent substance according to one aspect of the embodiment.

Embodiments will now be explained with reference to the accompanying drawings.

One aspect of the embodiment resides in a fluorescent substance represented by the following formula (1):

$$(M_{1-x}EC_x)_a Si_b AlO_c N_d \tag{1}$$

in which M is an element selected from the group consisting of the Group 1 elements, the Group 2 elements, the Group 3 elements, the Group 13 elements other than Al, rare earth elements, the Group 4 elements and the Group 14 elements other than Si; EC is an element selected from the group consisting of Eu, Ce, Mn, Tb, Yb, Dy, Sm, Tm, Pr, Nd, Pm, Ho, Er, Cr, Sn, Cu, Zn, As, Ag, Cd, Sb, Au, Hg, TI, Pb, Bi and Fe; and x, a, b, c and d are numbers satisfying the conditions of $0<x<0.4$, $0.55<a<0.80$, $2<b<3$, $0<c\leq0.6$ and $4<d<5$, respectively;

in the form of crystals whose mean grain size is in the range of 20 to 100 μm and whose aspect ratio is in the range of 2 to 4; and emitting luminescence having a peak in the wavelength range of 580 to 660 nm under excitation by light in the wavelength range of 250 to 500 nm.

In addition, another aspect of the embodiment resides in a light-emitting device, comprising:

a light-emitting element (S1) giving off light in the wavelength range of 250 to 500 nm;

a fluorescent substance (R) which is represented by the following formula (1):

$$(M_{1-x}EC_x)_a Si_b AlO_c N_d \tag{1}$$

in which M is an element selected from the group consisting of the Group 1 elements, the Group 2 elements, the Group 3 elements, the Group 13 elements other than Al, rare earth elements, the Group 4 elements and the Group 14 elements other than Si; EC is an element selected from the group consisting of Eu, Ce, Mn, Tb, Yb, Dy, Sm, Tm, Pr, Nd, Pm, Ho, Er, Cr, Sn, Cu, Zn, As, Ag, Cd, Sb, Au, Hg, TI, Pb, Bi and Fe; and x, a, b, c and d are numbers satisfying the conditions of $0<x<0.4$, $0.55<a<0.80$, $2<b<3$, $0<c\leq0.6$ and $4<d<5$, respectively; which is in the form of crystals whose mean grain size is in the range of 20 to 100 μm and whose aspect ratio is in the range of 2 to 4; and which emits luminescence having a peak in the wavelength range of 580 to 660 nm under excitation by light given off from said light-emitting element (S1);
and another fluorescent substance (G) which is represented by the following formula (2):

$$(M'_{1-x'}EC'_{x'})_{3-y'} Al_{3+z'} Si_{13-z'} O_{2+u'} N_{21-w'} \tag{2}$$

in which M' is an element selected from the group consisting of the Group 1 elements, the Group 2 elements, the Group 3 elements, the Group 13 elements other than Al, rare earth elements, the Group 4 elements and the Group 14 elements other than Si; EC' is an element selected from the group consisting of Eu, Ce, Mn, Tb, Yb, Dy, Sm, Tm, Pr, Nd, Pm, Ho, Er, Cr, Sn, Cu, Zn, As, Ag, Cd, Sb, Au, Hg, TI, Pb, Bi and Fe; and x', y', z', u' and w' are numbers satisfying the conditions of $0<x'\leq1$, $-0.1\leq y'\leq0.3$, $-3\leq z'\leq1$ and $-3<u'-w'\leq1.5$, respectively; and which emits luminescence having a peak in the wavelength range of 490 to 580 nm under excitation by light given off from said light-emitting element (S1).

Further, still another aspect of the embodiment resides in another light-emitting device, comprising:

a light-emitting element (S2) giving off light in the wavelength range of 250 to 430 nm;

a fluorescent substance (R) which is represented by the following formula (1):

$$(M_{1-x}EC_x)_a Si_b AlO_c N_d \tag{1}$$

in which M is an element selected from the group consisting of the Group 1 elements, the Group 2 elements, the Group 3 elements, the Group 13 elements other than Al, rare earth elements, the Group 4 elements and the Group 14 elements other than Si; EC is an element selected from the group consisting of Eu, Ce, Mn, Tb, Yb, Dy, Sm, Tm, Pr, Nd, Pm, Ho, Er, Cr, Sn, Cu, Zn, As, Ag, Cd, Sb, Au, Hg, TI, Pb, Bi and Fe; and x, a, b, c and d are numbers satisfying the conditions of $0<x<0.4$, $0.55<a<0.80$, $2<b<3$, $0<c\leq0.6$ and $4<d<5$, respectively; which is in the form of crystals whose mean grain size is in the range of 20 to 100 μm and whose aspect ratio is in the range of 2 to 4; and which emits luminescence having a peak in the wavelength range of 580 to 660 nm under excitation by light given off from said light-emitting element (S2);

another fluorescent substance (G) which is represented by the following formula (2):

$$(M'_{1-x'}EC'_{x'})_{3-y'} Al_{3+z'} Si_{13-z'} O_{2+u'} N_{21-w'} \tag{2}$$

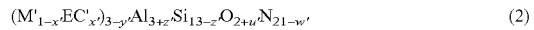

in which M' is an element selected from the group consisting of the Group 1 elements, the Group 2 elements, the Group 3 elements, the Group 13 elements other than Al, rare earth elements, the Group 4 elements and the Group 14 elements other than Si; EC' is an element selected from the group consisting of Eu, Ce, Mn, Tb, Yb, Dy, Sm, Tm, Pr, Nd, Pm, Ho, Er, Cr, Sn, Cu, Zn, As, Ag, Cd, Sb, Au, Hg, TI, Pb, Bi and Fe; and x', y', z', u' and w' are numbers satisfying the conditions of $0<x'\leq1$, $-0.1\leq y'\leq0.3$, $-3\leq z'\leq1$ and $-3<u'-w'\leq1.5$, respectively; and which emits luminescence having a peak in the wavelength range of 490 to 580 nm under excitation by light given off from said light-emitting element (S2); and still another fluorescent substance (B) which emits luminescence having a peak in the wavelength range of 400 to 490 nm under excitation by light given off from said light-emitting element (S2).

Furthermore, yet another aspect of the embodiment resides in a process for production of a red light-emitting fluorescent substance, comprising the steps of:

mixing materials including nitride or carbide of said M, nitride, oxide or carbide of Al, nitride, oxide or carbide of Si, and oxide, nitride or carbonate of said EC; and firing the mixture for a firing time of not more than 4 hours.

The present inventors have found that a red light-emitting fluorescent substance showing high quantum efficiency, giving strong emission intensity and having such favorable temperature characteristics that the emission intensity less decreases even if the temperature rises can be obtained by incorporating an emission center element into a particular oxynitride fluorescent substance whose crystal structure and composition are both restricted. Further, the present inventors have also found that a light-emitting device less undergoing color discrepancies even when operated with high power, namely, even at a high temperature, can be obtained by adopting the above red light-emitting fluorescent substance in combination with a particular green light-emitting one.

The following explains a red light-emitting fluorescent substance according to the embodiment and a light-emitting device employing that fluorescent substance.

Red Light-Emitting Fluorescent Substance

A red light-emitting fluorescent substance of the embodiment is represented by the following formula (1):

$$(M_{1-x}EC_x)_a Si_b Al O_c N_d \quad (1)$$

in which M is an element selected from the group consisting of the Group 1 elements, the Group 2 elements, the Group 3 elements, the Group 13 elements other than Al, rare earth elements, the Group 4 elements and the Group 14 elements other than Si; EC is an element selected from the group consisting of Eu, Ce, Mn, Tb, Yb, Dy, Sm, Tm, Pr, Nd, Pm, Ho, Er, Cr, Sn, Cu, Zn, As, Ag, Cd, Sb, Au, Hg, Tl, Pb, Bi and Fe; and x, a, b, c and d are numbers satisfying the conditions of $0<x<0.4$, $0.55<a<0.80$, $2<b<3$, $0<c\leq0.6$ and $4<d<5$, respectively.

In view of the variability of emission wavelength, the emission center element EC is preferably at least one of Eu and Mn.

The element M is preferably replaced with the emission center element EC in an amount of 0.1 mol % or more. If the amount is less than 0.1 mol %, it is difficult to obtain sufficient luminescence. The element M may be completely replaced with the mission center element EC, but decrease of the emission probability (concentration quenching) can be avoided as much as possible if the replaced amount is less than 50 mol %.

The red light-emitting fluorescent substance (R) of the embodiment emits yellow to red luminescence, namely, luminescence having a peak in the wavelength range of 580 to 660 nm when excited by light in the wavelength range of 250 to 500 nm.

In the formula (1), M is an element selected from the group consisting of the Group 1 elements, the Group 2 elements, the Group 3 elements, the Group 13 elements other than Al, rare earth elements, the Group 4 elements and the Group 14 elements other than Si; and x, a, b, c and d are numbers satisfying the conditions of $0<x<0.4$ (preferably, $0.01\leq x\leq0.3$, more preferably, $0.02\leq x\leq0.2$), $0.55<a<0.80$ (preferably, $0.65<a<0.70$, more preferably $0.66\leq a\leq0.69$), $2<b<3$ (preferably, $2.1\leq b\leq2.7$, more preferably, $2.2\leq b\leq2.4$), $0<c\leq0.6$ (preferably, $0.3<c<0.6$ more preferably, $0.43\leq c\leq0.51$), and $4<d<5$ (preferably, $4.1\leq d\leq4.5$, more preferably, $4.2\leq d\leq4.3$), respectively.

The red light-emitting fluorescent substance according to the embodiment is based on an inorganic compound having essentially the same crystal structure as $Sr_2Si_7Al_3ON_{13}$. However, the constituting element thereof is partly replaced with the luminance element and the content of each element is regulated in a particular range, and thereby it can be made possible for the substance to show high quantum efficiency and to have such favorable temperature characteristics that the substance less undergoes the temperature quenching when used in a light-emitting device. Hereinafter, the above crystal structure is often referred to as "$Sr_2Si_7Al_3ON_{13}$-type crystal".

The crystal of $Sr_2Si_7Al_3ON_{13}$ belongs to the orthorhombic system, and the lattice constants thereof are a=11.8033(13) Å, b=21.589(2) Å and c=5.0131(6) Å.

The fluorescent substance according to the embodiment can be identified by X-ray diffraction or neutron diffraction. This means that the present embodiment includes not only a substance exhibiting the same XRD profile as $Sr_2Si_7Al_3ON_{13}$ but also a substance having a crystal structure in which the constituting elements are so replaced with other elements as to change the lattice constants within particular ranges. The constituting elements of $Sr_2Si_7Al_3ON_{13}$ crystal may be replaced with other elements in such a way described below in detail. Specifically, Sr in the crystal may be replaced with the element M and/or the emission center element EC; the site of Si may be filled with one or more elements selected from the group consisting of tetravalent elements such as Ge, Sn, Ti, Zr and Hf; the site of Al may be filled with one or more elements selected from the group consisting of trivalent elements such as B, Ga, In, Sc, Y, La, Gd and Lu; and the site of O or N may be filled with one or more elements selected from the group consisting of O, N and C. Further, Al and Si may be partly substituted with each other, and/or O and N may be partly substituted with each other. Examples of that substance include $Sr_2Si_8Al_2N_{14}$, $Sr_2Si_6Al_4O_2N_{12}$, $Sr_2Si_5Al_5O_3N_{11}$ and $Sr_2Si_4Al_6O_4N_{10}$. These substances have crystal structures belonging to the $Sr_2Si_7Al_3ON_{13}$-type crystal.

In the case where the replacement of element is occurred slightly, it can be judged whether or not the substance has a crystal structure belonging to the $Sr_2Si_7Al_3ON_{13}$-type crystal by the following simple method. The XRD profile of the modified crystal is measured, and the positions of the diffraction peaks are compared with those in the XRD profile of $Sr_2Si_7Al_3ON_{13}$. As a result, if the positions of the main peaks are identical, those crystal structures can be regarded as the same.

The crystal structure preferably contains a component whose XRD profile measured by use of a specific X-ray of CuKα (wavelength: 1.54056 Å) shows diffraction peaks simultaneously at seven or more positions, preferably nine or more positions selected from the group consisting of eleven positions: 15.0 to 15.25°, 23.1 to 23.20°, 24.85 to 25.05°, 26.95 to 27.15°, 29.3 to 29.6°, 30.9 to 31.1°, 31.6 to 31.8°, 33.0 to 33.20°, 35.25 to 35.45°, 36.1 to 36.25° and 56.4 to 56.65°, in terms of diffraction angle (2θ). The XRD profile can be measured by means of, for example, M18XHF22-SRA type X-ray diffractometer ([trademark], manufactured by MAC Science Co. Ltd.). The measurement conditions are, for example, tube voltage: 40 kV, tube current: 100 mA, and scanning speed: 2°/minute.

The red light-emitting fluorescent substance of the embodiment is also characterized by being in the form of columnar crystals having a mean grain size in a particular range.

The red light-emitting fluorescent substance according to the embodiment is in the form of crystals whose mean grain size is in the range of 20 to 100 μm, preferably 20 to 40 μm, more preferably 20 to 30 μm. Further, it is preferred that a lower limit of the mean grain size is equal with or more than 25 μm. The mean grain size is determined by means of a laser diffraction particle size analyzer (SALD-2000J [trademark], manufactured by Shimadzu Corp.).

On the other hand, the red light-emitting fluorescent substance of the embodiment is in the form of columnar crystals, and the aspect ratio thereof is in the range of 2 to 4, preferably 3 to 4. Here, the term "aspect ratio" means a ratio of L/r in which L is a longitudinal length of the columnar crystal and r is a major axis length of the sectional ellipse perpendicular to the longitudinal length of the columnar crystal. The values of L and r are determined by observation with a scanning electron microscope. The substance of the embodiment may contain crystals having an aspect ratio out of the above range, but they are in an amount of preferably 20% or less.

Process For Production of Red Light-Emitting Fluorescent Substance

There is no particular restriction on the process for production of the red light-emitting fluorescent substance according to the embodiment, as long as it provides the substance having the above particular composition in the above particular form. However, such particular red light-emitting fluorescent substance can be produced in the following manner.

The fluorescent substance of the embodiment can be synthesized from starting materials, such as: nitride of the element M; nitride, oxide and carbide of Al and/or Si; and oxide, nitride and carbonate of the emission center element EC. For example, if the substance containing Eu as the emission center element EC is to be produced, examples of usable materials include $Sr_3N$, AlN, $Si_3N_4$, $Al_2O_3$ and EuN. The material $Sr_3N_2$ can be replaced with $Ca_3N_2$, $Ba_3N_2$, $Sr_2N$, SrN or a mixture thereof. Those materials are weighed out and mixed so that the aimed composition can be obtained, and then the powder mixture is fired in a crucible to produce the aimed fluorescent substance. The materials are mixed, for example, in a mortar in a glove box. The crucible is made of, for example, boron nitride, silicon nitride, silicon carbide, carbon, aluminum nitride, SiAlON, aluminum oxide, molybdenum or tungsten.

The red light-emitting fluorescent substance according to the embodiment can be obtained by firing the mixture of the starting materials for a predetermined time. The production process of the embodiment is characterized by a short firing time. Specifically, the firing time in the production process of the embodiment must be not more than 4 hours, and is preferably 3 hours or less, more preferably 2 hours or less, most preferably 1 hour or less. This is because, if the firing time is too long, the crystals aggregate to increase the grain size and consequently to lower the quantum efficiency. Further, if the firing time is too long, the resultant product is liable to contain a decreased amount of the crystals having the above particular aspect ratio. However, from the viewpoint of making the reaction fully proceed, the firing time is preferably not less than 0.1 hour, more preferably not less than 0.2 hour, most preferably not less than 0.5 hour. The firing may be carried out either once for all or twice or more successively.

The firing is preferably carried out under a pressure more than the atmospheric pressure. If silicon nitride is used as one of the materials, the pressure is preferably not less than 5 atmospheres so as to prevent the silicon nitride from decomposing at a high temperature. The firing temperature is preferably in the range of 1500 to 2000° C., more preferably in the range of 1600 to 1900° C. If the temperature is less than 1500° C., it is often difficult to obtain the aimed fluorescent substance. On the other hand, if the temperature is more than 2000° C., there is a fear that the materials or the product may be sublimated. Further, the firing is preferably carried out under $N_2$ atmosphere because AlN is liable to be oxidized. In that case, $N_2/H_2$ mixed gas atmosphere is also usable.

The fired product in the form of powder is then subjected to after-treatment such as washing, if necessary, to obtain a fluorescent substance according to the embodiment. If performed, washing can be carried out with acid or pure water.

Green Light-Emitting Fluorescent Substance

A green light-emitting fluorescent substance (G) usable in the light-emitting device of the embodiment is, for example, represented by the following formula (2):

$$(M'_{1-x'}EC'_{x'})_{3-y'}Al_{3+z'}Si_{13-z'}O_{2+u'}N_{21-w'} \qquad (2)$$

In the formula (2), M' is an element selected from the group consisting of the Group 1 elements, the Group 2 elements, the Group 3 elements, the Group 13 elements other than Al, rare earth elements, the Group 4 elements and the Group 14 elements other than Si; EC' is an element selected from the group consisting of Eu, Ce, Mn, Tb, Yb, Dy, Sm, Tm, Pr, Nd, Pm, Ho, Er, Cr, Sn, Cu, Zn, As, Ag, Cd, Sb, Au, Hg, Tl, Pb, Bi and Fe; and x', y', z', u' and w' are numbers satisfying the conditions of $0<x'\leq 1$ (preferably, $0.001\leq x'\leq 0.5$), $-0.1\leq y'\leq 0.3$ (preferably, $-0.1\leq y'\leq 0.15$, more preferably, $-0.09\leq y'\leq 0.07$), $-3\leq z'\leq 1$ (preferably, $-1\leq z'\leq 1$, more preferably, $0.2\leq z'\leq 1$) and $-3<u'-w'\leq 1.5$ (preferably, $-1<u'-w'\leq 1$, more preferably, $-0.1\leq 5u'-w'\leq 0.3$), respectively.

The green light-emitting fluorescent substance (G) usable in the light-emitting device of the embodiment is based on an inorganic compound having essentially the same crystal structure as $Sr_3Al_3Si_{13}O_2N_{21}$. However, the constituting element thereof is partly replaced with the luminance element and the content of each element is regulated in a particular range, and thereby it can be made possible for the substance to show high quantum efficiency.

The above green light-emitting fluorescent substance can be identified by X-ray diffraction or neutron diffraction. This means that the green light-emitting fluorescent substance includes not only a substance exhibiting the same XRD profile as $Sr_3Al_3Si_{13}O_2N_{21}$ but also a substance having a crystal structure in which the constituting elements are so replaced with other elements as to change the lattice constants within particular ranges. The constituting elements of $Sr_3Al_3Si_{13}O_2N_{21}$ crystal may be replaced with other elements in such a way described below in detail. Specifically, Sr in the crystal may be replaced with the element M' and/or the emission center element EC'; the site of Si may be filled with one or more elements selected from the group consisting of tetravalent elements such as Ge, Sn, Ti, Zr and Hf; the site of Al may be filled with one or more elements selected from the group consisting of trivalent elements such as B, Ga, In, Sc, Y, La, Gd and Lu; and the site of O or N may be filled with one or more elements selected from the group consisting of O, N and C. Further, Al and Si may be partly substituted with each other, and/or O and N may be partly substituted with each other. Examples of that substance include $Sr_3Al_2Si_{14}ON_{22}$, $Sr_3AlSi_{15}N_{23}$, $Sr_3Al_4Si_{12}O_3N_{20}$, $Sr_3Al_5Si_{11}O_4N_{19}$ and $Sr_3Al_6Si_{10}O_5N_{18}$. These substances have crystal structures belonging to the same group as the $Sr_3Al_3Si_{13}O_2N_{21}$ crystal.

In the case where the element replacement is occurred slightly, it can be judged whether or not the substance has a crystal structure belonging to the same group as the $Sr_3Al_3Si_{13}O_2N_{21}$ crystal by the same simple method as described above for the red light-emitting fluorescent substance.

Process For Production of Green Light-Emitting Fluorescent Substance

The green light-emitting fluorescent substance usable in the embodiment can be synthesized from starting materials, such as: nitride of the element M'; nitride, oxide and carbide of Al and/or Si; and oxide, nitride and carbonate of the emission center element EC'. For example, if the substance containing Sr and Eu as the element M' and the emission center element EC', respectively, is to be produced, examples of usable materials include $Sr_3N_2$, AlN, $Si_3N_4$, $Al_2O_3$ and EuN. The material $Sr_3N_2$ can be replaced with $Ca_3N_2$, $Ba_3N_2$, $Sr_2N$, SrN or a mixture thereof. Those materials are weighed out and mixed so that the aimed composition can be obtained, and then the powdery mixture is fired in a crucible to produce the aimed fluorescent substance. The materials are mixed, for example, in a mortar in a glove box. The crucible is made of, for example, boron nitride, silicon nitride, silicon carbide, carbon, aluminum nitride, SiAlON, aluminum oxide, molybdenum or tungsten.

The green light-emitting fluorescent substance usable in the embodiment can be obtained by firing the mixture of the starting materials for a predetermined time. The firing is preferably carried out under a pressure more than the atmospheric pressure. If silicon nitride is used as one of the materials, the pressure is preferably not less than 5 atmospheres so as to prevent the silicon nitride from decomposing at a high temperature. The firing temperature is preferably in the range of 1500 to 2000° C., more preferably in the range of 1600 to 1900° C. If the temperature is less than 1500° C., it is often difficult to obtain the aimed fluorescent substance. On the other hand, if the temperature is more than 2000° C., there is a fear that the materials or the product may be sublimated. Further, the firing is preferably carried out under $N_2$ atmosphere because AlN is liable to be oxidized. In that case, $N_2/H_2$ mixed gas atmosphere is also usable.

The firing may be carried out either once for all or twice or more successively. If the firing is carried out twice or more successively, each firing time depends on conditions of the powder mixture and is preferably 0.1 to 4.0 hours, more preferably 0.1 to 2.0 hours.

The fired product in the form of powder is then subjected to after-treatment such as washing, if necessary, to obtain a fluorescent substance usable in the embodiment. If performed, washing can be carried out with acid or pure water.

Blue Light-Emitting Fluorescent Substance

As described later, the light-emitting device of the embodiment comprises the aforementioned red and green light-emitting fluorescent substances in combination. In addition, the device may further comprise a blue light-emitting fluorescent substance. There is no particular restriction on the blue light-emitting fluorescent substance as long as it emits luminescence having a peak in the wavelength range of 400 to 490 nm.

However, if the blue light-emitting fluorescent substance has poor temperature characteristics, the resultant light radiated from the device may have chromaticity shifted toward the yellow side when the temperature rises in accordance with increase of the applied power. This may be a problem particularly if white light is required. Accordingly, for the purpose of achieving the object of the present embodiment, namely, in order to provide a light-emitting device less undergoing color discrepancies, it is preferred for the blue light-emitting fluorescent substance to have temperature characteristics as excellent as the red and green light-emitting ones Examples of the preferred blue light-emitting fluorescent substance include $(Ba,Eu)MgAl_{10}O_{17}$, $(Sr,Ca,Ba,Eu)_{10}(PO_4)_5Cl_2$ and $(Sr,Eu)Si_9Al_{19}ON_{31}$.

Light-Emitting Device

A light-emitting device according to the embodiment comprises the above fluorescent substances and a light-emitting element capable of exciting the fluorescent substances.

The device according to one aspect of the embodiment comprises: a LED serving as an excitation source; and a combination of the aforementioned red light-emitting fluorescent substance (R) and the green light-emitting fluorescent substance (G) each of which emits luminescence under excitation by light given off from the LED. Accordingly, the light-emitting device radiates light synthesized with emissions from the LED and the red and green fluorescent substances.

The light-emitting device according to another aspect of the embodiment comprises: a LED serving as an excitation source; and a combination of the above red light-emitting fluorescent substance (R), the above green light-emitting fluorescent substance (G), and the blue light-emitting fluorescent substance (B) each of which emits luminescence under excitation by light given off from the LED.

The device according to either aspect of the embodiment indispensably comprises the particular red light-emitting fluorescent substance (R) and the particular green light-emitting fluorescent substance (G) in combination, and thereby the color balance between red and green in the light radiated from the device is prevented from being lost while the device is working, so that the color discrepancies are prevented. Further, since less undergoing the temperature quenching in operation, those particular fluorescent substances hardly lose the luminance balances with the emission from the LED and with the blue luminescence from the blue light-emitting fluorescent substance. This also contributes to prevention of the color discrepancies.

In the present embodiment, both the red and green light-emitting fluorescent substances less undergo the temperature quenching. They therefore enable to realize a light-emitting device radiating light in which red and green light components less fluctuate even when the device is operated with high power. Further, since the temperature quenching acts on those two substances to a similar degree at temperatures from room temperature to approx. 200° C., they also enable to realize a light-emitting device radiating light less suffering from color discrepancies of red and green light components even when the device temperature is increased by operation with high power. Although it is possible to produce a light-emitting device even if red and green light-emitting fluorescent substances used therein are different from the substances regulated in the present embodiment, such device is generally incapable of benefitting fully from the effect of preventing color discrepancies, as compared with the device of the embodiment.

The blue light-emitting fluorescent substance, if used, preferably undergoes the temperature quenching to the same degree as the red and green light-emitting ones because color discrepancies can be further effectively prevented. However, since the luminescence from the blue light-emitting fluorescent substance can be compensated with the emission from a LED serving as the excitation light-emitting element, the blue light-emitting fluorescent substance does not need to be regulated so strictly as the red and green light-emitting ones.

The light-emitting element used in the device is properly selected according to the fluorescent substances used together. Specifically, it is necessary that light given off from the light-emitting element should be capable of exciting the fluorescent substances. Further, if the device is preferred to radiate white light, the light-emitting element preferably gives off light of such a wavelength that it can compensate luminescence emitted from the fluorescent substances.

In view of the above, if the device comprises the red and green fluorescent substances, the light-emitting element (S1) is generally so selected that it gives off light in the wavelength range of 250 to 500 nm. If the device comprises the red, green and blue fluorescent substances, the light-emitting element (S2) is generally so selected that it gives off light of 250 to 430 nm.

The light-emitting device according to the embodiment can be in the form of any conventionally known light-emitting device. FIG. 1 is a vertical sectional view schematically illustrating a light-emitting device of the embodiment.

In the light-emitting device shown in FIG. 1, a resin system 100 comprises leads 101 and 102 molded as parts of a lead frame and also a resin member 103 formed by unified molding together with the lead frame. The resin member 103 gives a concavity 105 in which the top opening is larger than the bottom. On the inside wall of the concavity, a reflective surface 104 is provided.

At the center of the nearly circular bottom of the concavity 105, a light-emitting element 106 is mounted with Ag paste or the like. Examples of the light-emitting element 106 include a light-emitting diode and a laser diode. The light-emitting element may radiate UV light. There is no particular restriction on the light-emitting element. Accordingly, it is also possible to adopt an element capable of emitting blue, bluish violet or near UV light as well as UV light. For example, a semiconductor light-emitting element such as GaN can be used as the light-emitting element. The electrodes (not shown) of the light-emitting element 106 are connected to the leads 101 and 102 by way of bonding wires 107 and 108 made of Au or the like, respectively. The positions of the leads 101 and 102 can be adequately modified.

In the concavity 105 of the resin member 103, a phosphor layer 109 is provided. For forming the phosphor layer 109, a mixture 110 containing the fluorescent substance of the embodiment can be dispersed or precipitated in an amount of 5 to 50 wt % in a resin layer 111 made of silicone resin or the like. The fluorescent substance of the embodiment comprises an oxynitride matrix having high covalency, and hence is generally so hydrophobic that it has good compatibility with the resin. Accordingly, scattering at the interface between the resin and the fluorescent substance is prevented enough to improve the light-extraction efficiency.

The light-emitting element 106 may be of a flip chip type in which n-type and p-type electrodes are placed on the same plane. This element can avoid troubles concerning the wires, such as disconnection or dislocation of the wires and light-absorption by the wires. In that case, therefore, it is possible to obtain a semiconductor light-emitting device excellent both in reliability and in luminance. Further, it is also possible to employ an n-type substrate in the light-emitting element 106 so as to produce a light-emitting device constituted as described below. In that device, an n-type electrode is formed on the back surface of the n-type substrate while a p-type electrode is formed on the top surface of the semiconductor layer on the substrate. One of the n-type and p-type electrodes is mounted on one of the leads, and the other electrode is connected to the other lead by way of a wire. The size of the light-emitting element 106 and the dimension and shape of the concavity 105 can be properly changed.

The light-emitting device according to the embodiment is not restricted to the package cup-type shown in FIG. 1, and can be freely applied to any type of devices. For example, even if the fluorescent substance according to the embodiment is used in a shell-type or surface-mount type light-emitting device, the same effect can be obtained.

EXAMPLES

The embodiment is further explained by the following examples, which by no means restrict the embodiment.

Example 1

As the starting materials, $Sr_3N_2$, EuN, $Si_3N_4$, $Al_2O_3$ and AlN in the amounts of 2.676 g, 0.398 g, 6.080 g, 0.680 g and 0.683 g, respectively, were weighed out and dry-mixed in an agate mortar in a vacuum glove box. The mixture was placed in a BN crucible and then fired at 1850° C. for 4 hours under 7.5 atm of $N_2$ atmosphere, to synthesize a fluorescent substance (G1) whose designed composition was $(Sr_{0.92}Eu_{0.08})_3Al_3Si_{13}O_2N_{21}$.

The substance (G1) after firing was in the form of yellowish green powder, and emitted green luminescence when exited with black light.

Independently, $Sr_3N_2$, EuN, $Si_3N_4$, $Al_2O_3$ and AlN as the starting materials in the amounts of 2.579 g, 0.232 g, 4.583 g, 0.476 g and 1.339 g, respectively, were weighed out and dry-mixed in an agate mortar in a vacuum glove box. The mixture was placed in a BN crucible and then fired at 1850° C. for 4 hours under 7.5 atm of $N_2$ atmosphere, to synthesize a fluorescent substance (R1) whose designed composition was $(Sr_{0.95}Eu_{0.05})_2Al_3Si_7ON_{13}$.

Figure 2:
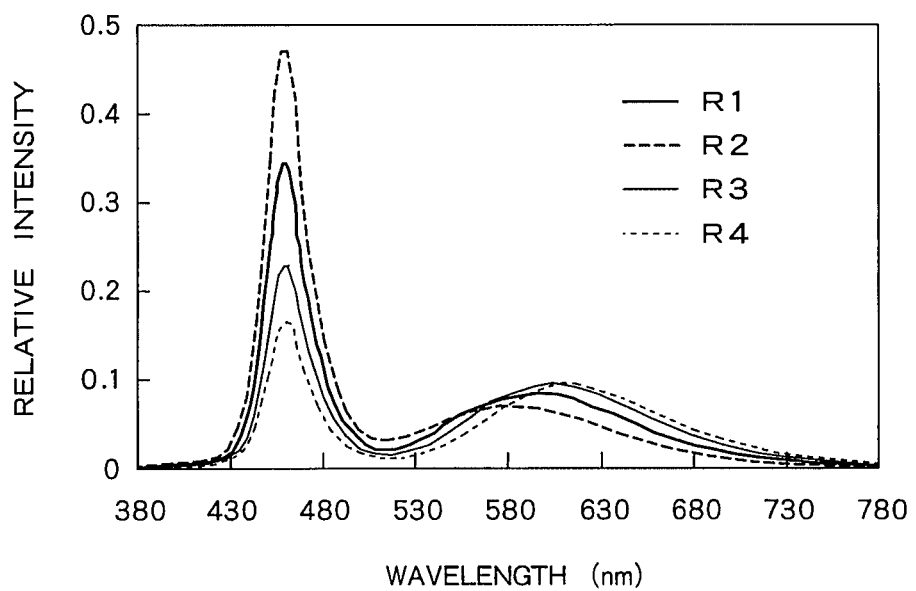
FIG. 2 shows emission spectra of the red fluorescent substances produced in Examples 1 to 4 under excitation by light at 460 nm.

The substance (R1) after firing was in the form of orange powder, and emitted red luminescence when exited with black light. FIG. 2 shows an emission spectrum of the red light-emitting fluorescent substance (R1) under excitation by light at 457 nm. The obtained substance (R1) was found to be in the form of crystals whose mean grain size and aspect ratio were 29 μm and 2.8, respectively. FIG. 3 shows temperature dependence of the emission intensity given by each of the green and red light-emitting fluorescent substances (G1) and (R1), provided that the intensity at room temperature is regarded as 1.0.

A light-emitting device was produced by use of those fluorescent substances. The device had a structure according to FIG. 4. Specifically, a LED 402 emitting light having a peak at 455 nm was soldered on an 8 mm-square AlN package substrate 401, and was connected to electrodes by way of gold wires 403. The LED was then domed with transparent resin 404, and the dome was coated with a layer of transparent resin 405 containing 30 wt % of the red light-emitting fluorescent substance (R1) capable of giving off luminescence having a peak at 598 nm. Further, another layer of transparent resin 406 containing 30 wt % of the fluorescent substance (G1) was formed thereon, to produce a light-emitting device. The produced device was placed in an integrating sphere, and was then worked with 20 mA and 3.1 V. The radiated light was observed and found to have a chromaticity of (0.345, 0.352), a color temperature of 5000K, a luminous flux efficiency of 67.9 lm/W and Ra=86. FIG. 5 shows an emission spectrum of the produced device.

While the drive current was being increased to 350 mA, the luminance characteristics of the device were measured in the manner described above. As a result shown in FIG. 6, the chromaticity fluctuated in such a small range even when the drive current was increased, as not to deviate from the chromaticity range regulated by HS (Japanese Industrial Standards) even when the device was operated with 350 mA. The luminous flux efficiency and Ra also fluctuated in such small ranges as to be 52.0 lm/W and Ra=79, respectively, at 240 mA; 48.3 lm/W and Ra=77, respectively, at 300 mA; and 43.9 lm/W and Ra=75, respectively, at 350 mA.

Example 2

The green light-emitting fluorescent substance (G1) was synthesized in the same manner as in Example 1. The procedure of Example 1 was then repeated except that the firing time was changed into 2 hours, to synthesize a red light-emitting fluorescent substance (R2). FIG. 2 shows an emission spectrum of the red light-emitting fluorescent substance (R2) under excitation by light at 457 nm. The obtained substance (R2) was found to be in the form of crystals whose mean grain size and aspect ratio were 28 μm and 2.2, respectively.

A light-emitting device was produced by use of those fluorescent substances in the same manner as in Example 1. The produced device was placed in an integrating sphere, and was then worked with 20 mA and 3.1 V. The radiated light was observed and found to have a chromaticity of (0.345, 0.352), a color temperature of 5000K, a luminous flux efficiency of 73.8 lm/W and Ra=79. FIG. 7 shows an emission spectrum of the produced device.

While the drive current was being increased to 350 mA, the luminance characteristics of the device were measured in the manner described above. The results were almost the same as those of Example 1. Specifically, the chromaticity fluctuated in a small range even when the drive current was increased. The luminous flux efficiency and Ra also fluctuated in such small ranges as to be 56.8 lm/W and Ra=78, respectively, at 240 mA; 53.5 lm/W and Ra=77, respectively, at 300 mA; and 49.1 lm/W and Ra=76, respectively, at 350 mA.

Example 3

The green light-emitting fluorescent substance (G1) was synthesized in the same manner as in Example 1. The procedure of Example 1 was then repeated except that the firing time was changed into 0.5 hour, to synthesize a red light-emitting fluorescent substance (R3). FIG. 2 shows an emission spectrum of the red light-emitting fluorescent substance (R3) under excitation by light at 457 nm. The obtained substance (R3) was found to be in the form of crystals whose mean grain size and aspect ratio were 26 μm and 3.7, respectively.

Figure 8:
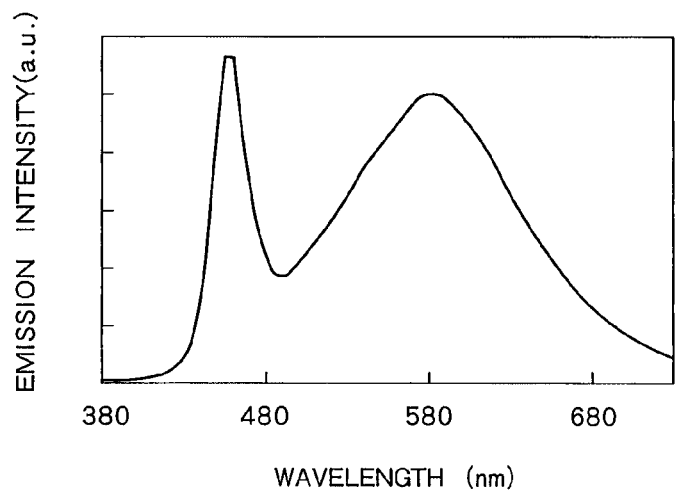
FIG. 8 shows an emission spectrum of the light-emitting device produced in Example 3.
Figure 9:
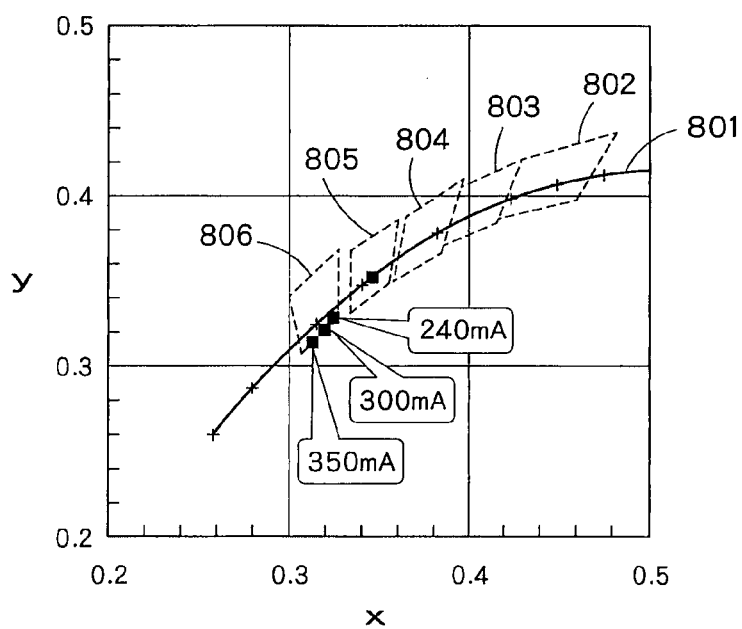
FIG. 9 shows a relation between the chromaticity point (2 degree field of view) and the drive current with regard to the light-emitting device produced in Example 3.

A light-emitting device was produced by use of those fluorescent substances in the same manner as in Example 1. The produced device was placed in an integrating sphere, and was then worked with 20 mA and 3.1 V. The radiated light was observed and found to have a chromaticity of (0.345, 0.352), a color temperature of 5000K, a luminous flux efficiency of 64.8 lm/W and Ra=90. FIG. 8 shows an emission spectrum of the produced device working at 20 mA drive current. While the drive current was being increased to 350 mA, the luminance characteristics of the device were measured in the manner described above. As a result shown in FIG. 9, the chromaticity fluctuated in such a small range even when the drive current was increased, as not to deviate from the chromaticity range regulated by JIS (Japanese Industrial Standards) even when the device was operated with 350 mA. The luminous flux efficiency and Ra also fluctuated in such small ranges as to be 51.0 lm/W and Ra=85, respectively, at 240 mA; 48.0 lm/W and Ra=84, respectively, at 300 mA; and 44.3 lm/W and Ra=82, respectively, at 350 mA.

Example 4

The green light-emitting fluorescent substance (G1) was synthesized in the same manner as in Example 1. The procedure of Example 1 was then repeated except that only the firing atmosphere was changed, to synthesize a red light-emitting fluorescent substance (R4). The firing atmosphere was changed into $H_2/N_2=5:5$ atmosphere. FIG. 2 shows an emission spectrum of the red light-emitting fluorescent substance (R4) under excitation by light at 457 nm. The obtained substance (R4) was found to be in the form of crystals whose mean grain size and aspect ratio were 36 μm and 2.0, respectively.

A light-emitting device was produced by use of those fluorescent substances. Specifically, a LED emitting light having a peak at 390 nm was soldered on an 8 mm-square AlN package substrate, and was connected to electrodes by way of gold wires. The LED was then domed with transparent resin, and the dome was coated with a layer of transparent resin containing 30 wt % of the red light-emitting fluorescent substance (R4) capable of giving off luminescence having a peak at 598 nm. Further, another layer of transparent resin containing 30 wt % of the fluorescent substance (G1) and still another layer of transparent resin containing 30 wt % of a blue light-emitting fluorescent substance $(Ba_{0.9}Eu_{0.1})MgAl_{10}O_{17}$ (B1) were stacked thereon, to produce a light-emitting device. FIG. 10 shows temperature dependence of the emission intensity given by each of the green, red and blue light-emitting fluorescent substances (G1), (R4) and (B1), provided that the intensity at room temperature is regarded as 1.0.

The produced device was placed in an integrating sphere, and was then worked with 20 mA and 3.1 V. The radiated light was observed and found to have a chromaticity of (0.345, 0.352), a color temperature of 5000K, a luminous flux efficiency of 62.39 lm/W and Ra=90. FIG. 11 shows an emission spectrum of the produced device.

While the drive current was being increased to 350 mA, the luminance characteristics of the device were measured in the manner described above. As a result shown in FIG. 12, the chromaticity fluctuated in such a small range even when the drive current was increased, as not to deviate from the chromaticity range of natural white regulated by JIS (Japanese Industrial Standards) even when the device was operated with 350 mA. The luminous flux efficiency, Ra and chromaticity fluctuated in such small ranges as to be 47.7 lm/W, Ra=89 and (x, y)=(0.341, 0.348), respectively, at 240 mA; 44.7 lm/W, Ra=88 and (x, y)=(0.339, 0.349), respectively, at 300 mA; and 41.5 lm/W, Ra=88 and (x, y)=(0.336, 0.347), respectively, at 350 mA.

Example 5

The green light-emitting fluorescent substance (G1) was synthesized in the same manner as in Example 1. The procedure of Example 2 was then repeated except that only the firing atmosphere was changed into $H_2/N_2=5:5$ atmosphere, to synthesize a red light-emitting fluorescent substance (R5). The obtained substance (R5) was found to be in the form of crystals whose mean grain size and aspect ratio were 34 μm and 2.8, respectively.

A light-emitting device was produced by use of those fluorescent substances in the same manner as in Example 4. The produced device was placed in an integrating sphere, and was then worked with 20 mA and 3.1 V. The radiated light was observed and found to have a chromaticity of (0.345, 0.352), a color temperature of 5000K, a luminous flux efficiency of 70.49 lm/W and Ra=81. FIG. 13 shows an emission spectrum of the produced device.

While the drive current was being increased to 350 mA, the luminance characteristics of the device were measured in the manner described above. As a result shown in FIG. 14, the chromaticity fluctuated in such a small range even when the drive current was increased, as not to deviate from the chromaticity range of natural white regulated by JIS (Japanese Industrial Standards) even when the device was operated with 350 mA. The luminous flux efficiency, Ra and chromaticity fluctuated in such small ranges as to be 53.5 lm/W, Ra=81 and (x, y)=(0.341, 0.348), respectively, at 240 mA; 50.2 lm/W, Ra=81 and (x, y)=(0.340, 0.346), respectively, at 300 mA; and 46.1 lm/W, Ra=81 and (x, y)=(0.337, 0.343), respectively, at 350 mA.

Example 6

The green light-emitting fluorescent substance (G1) was synthesized in the same manner as in Example 2. The procedure of Example 3 was then repeated except that only the firing atmosphere was changed, to synthesize a red light-emitting fluorescent substance (R6). The firing atmosphere was changed into $H_2/N_2$=5:5 atmosphere. The obtained substance (R6) was found to be in the form of crystals whose mean grain size and aspect ratio were 27 μm and 3.2, respectively.

A light-emitting device was produced by use of those fluorescent substances in the same manner as in Example 4. The produced device was placed in an integrating sphere, and was then worked with 20 mA and 3.1 V. The radiated light was observed and found to have a chromaticity of (0.345, 0.352), a color temperature of 5000K, a luminous flux efficiency of 59.79 lm/W and Ra=92. FIG. 15 shows an emission spectrum of the produced device.

While the drive current was being increased to 350 mA, the luminance characteristics of the device were measured in the manner described above. As a result shown in FIG. 16, the chromaticity fluctuated in such a small range even when the drive current was increased, as not to deviate from the chromaticity range of natural white regulated by JIS (Japanese Industrial Standards) even when the device was operated with 350 mA. The luminous flux efficiency, Ra and chromaticity fluctuated in such small ranges as to be 46.5 lm/W, Ra=91 and (x, y)=(0.34, 0.351), respectively, at 240 mA; 43.5 lm/W, Ra=81 and (x, y)=(0.339, 0.35), respectively, at 300 mA; and 39.9 lm/W, Ra=90 and (x, y)=(0.336, 0.348), respectively, at 350 mA.

Example 7

The green light-emitting fluorescent substance (G1) was synthesized in the same manner as in Example 1.

Independently, $Sr_3N_2$, EuN, $Si_3N_4$ and AlN as the starting materials in the amounts of 2.625 g, 0.237 g, 4.911 g and 1.844 g, respectively, were weighed out and dry-mixed in an agate mortar in a vacuum glove box. The mixture was placed in a BN crucible and then fired at 1850° C. for 4 hours under 7.5 atm of $N_2$ atmosphere, to synthesize a fluorescent substance (R7) whose designed composition was $(Sr_{0.95}Eu_{0.05})_2Al_3Si_7N_{14}$.

The fluorescent substance (R7) after firing was in the form of orange powder, and emitted red luminescence when exited with black light. The obtained substance (R7) was found to be in the form of crystals whose mean grain size and aspect ratio were 83 μm and 3.1, respectively.

A light-emitting device was produced by use of those fluorescent substances in the same manner as in Example 1. The produced device was placed in an integrating sphere, and was then worked with 20 mA and 3.1 V. The radiated light was observed and found to have a chromaticity of (0.345, 0.352), a color temperature of 5000K, a luminous flux efficiency of 69.3 lm/W and Ra=90.

Example 8

The green light-emitting fluorescent substance (G1) was synthesized in the same manner as in Example 1.

Independently, $Sr_3N_2$, EuN, $Si_3N_4$ and AlN as the starting materials in the amounts of 2.667 g, 0.166 g, 5.086 g and 1.691 g, respectively, were weighed out and dry-mixed in an agate mortar in a vacuum glove box. The mixture was placed in a BN crucible and then fired at 1850° C. for 4 hours under 7.5 atm of $N_2$ atmosphere, to synthesize a fluorescent substance (R8) whose designed composition was $(Sr_{0.96}Eu_{0.04})_2Al_3Si_7N_{14}$.

The fluorescent substance (R8) after firing was in the form of orange powder, and emitted red luminescence when exited with black light. The obtained substance (R8) was found to be in the form of crystals whose mean grain size and aspect ratio were 69 μm and 2.5, respectively.

A light-emitting device was produced by use of those fluorescent substances in the same manner as in Example 1. The produced device was placed in an integrating sphere, and was then worked with 20 mA and 3.1 V. The radiated light was observed and found to have a chromaticity of (0.345, 0.352), a color temperature of 5000K, a luminous flux efficiency of 69.7 lm/W and Ra=89.

Example 9

As the starting materials, $SrCO_3$, $Eu_2O_3$, $Si_3N_4$ and AlN in the amounts of 0.664 g, 0.792 g, 3.788 g and 7.009 g, respectively, were weighed out and dry-mixed in an agate mortar in a vacuum glove box. The mixture was placed in a BN crucible and then fired at 1800° C. for 4 hours under 7.5 atm of $N_2$ atmosphere, to synthesize a fluorescent substance (B2) whose designed composition was $(Sr_{0.50}Eu_{0.50})_3Al_{19}Si_9ON_{31}$.

The procedure of Example 1 was then repeated to synthesize green and red light-emitting fluorescent substances (G1) and (R1). FIG. 17 shows temperature dependence of the emission intensity given by each of the green, red and blue light-emitting fluorescent substances (G1), (R1) and (B2), provided that the intensity at room temperature is regarded as 1.0.

With respect to the red light emitting fluorescent substances synthesized in Examples 1 to 9, XRD profiles were measured by use of a specific X-ray of CuKα (wavelength: 1.54056 Å). FIG. 18 shows an XRD profile of the fluorescent substance (R1) obtained in Example 1. All the red light emitting fluorescent substances produced in Examples 1 to 9 had crystal structures belonging to the orthorhombic system, and each XRD profile exhibited diffraction peaks at eleven positions: 15.0 to 15.25°, 23.1 to 23.20°, 24.85 to 25.05°, 26.95 to 27.15°, 29.3 to 29.6°, 30.9 to 31.1°, 31.6 to 31.8°, 33.0 to 33.20°, 35.25 to 35.45°, 36.1 to 36.25° and 56.4 to 56.65°, in terms of diffraction angle (2θ).

The XRD profiles were measured by means of, for example, M18XHF22-SRA type X-ray diffractometer ([trademark], manufactured by MAC Science Co. Ltd.). The measurement conditions were: tube voltage: 40 kV, tube current: 100 mA, and scanning speed: 2°/minute.

A light-emitting device was produced by use of those fluorescent substances in the same manner as in Example 4. The produced device was placed in an integrating sphere, and was then worked with 20 mA and 3.1 V. The radiated light was observed and found to have a chromaticity of (0.345, 0.352), a color temperature of 5000K, a luminous flux efficiency of 56.09 lm/W and Ra=89. FIG. 19 shows an emission spectrum of the produced device.

While the drive current was being increased to 350 mA, the luminance characteristics of the device were measured in the manner described above. As a result shown in FIG. 20, the chromaticity fluctuated in such a small range even when the drive current was increased, as not to deviate from the chromaticity range of natural white regulated by JIS (Japanese Industrial Standards) even when the device was operated with 350 mA. The luminous flux efficiency, Ra and chromaticity fluctuated in such small ranges as to be 43.9 lm/W, Ra=85 and (x, y)=(0.331, 0.340), respectively, at 240 mA; 41.9 lm/W, Ra=85 and (x, y)=(0.329, 0.339), respectively, at 300 mA; and 38.0 lm/W, Ra=84 and (x, y)=(0.327, 0.337), respectively, at 350 mA.

Comparative Example 1

The green light-emitting fluorescent substance (G1) was synthesized in the same manner as in Example 1. The procedure of Example 1 was then repeated except that the firing time was changed into 16 hours, to synthesize a red light-emitting fluorescent substance (R9) for comparison.

The substance (R9) after firing was in the form of orange powder, and emitted red luminescence when exited with black light. FIG. 21 shows an emission spectrum of the red light-emitting fluorescent substance (R9) under excitation by light at 460 nm. The obtained substance (R9) was found to be in the form of crystals whose mean grain size and aspect ratio were 42 µm and 1.8, respectively. FIG. 22 shows temperature dependence of the emission intensity given by each of the green and red light-emitting fluorescent substances (G1) and (R9), provided that the intensity at room temperature is regarded as 1.0. The substance (R9) was then subjected to X-ray diffraction analysis with a specific X-ray of CuKα (wavelength: 1.54056 Å), to obtain an XRD profile having peaks at 8.64°, 11.18° and 18.30° other than peaks corresponding to XRD profile of the fluorescent substance (R1). A certain amount of variant phase crystals and deformed crystals were found in the fluorescent substance.

A light-emitting device was produced by use of those fluorescent substances in the same manner as in Example 4. The produced device was placed in an integrating sphere, and was then worked with 20 mA and 3.1 V. The radiated light was observed and found to have a chromaticity of (0.345, 0.352), a color temperature of 5000K, a luminous flux efficiency of 24.0 lm/W and Ra=91. FIG. 23 shows an emission spectrum of the produced device.

While the drive current was being increased to 350 mA, the luminance characteristics of the device were measured in the manner described above. As a result shown in FIG. 24, the chromaticity fluctuated in such a large range when the drive current was increased, as to deviate considerably from the chromaticity range regulated by JIS (Japanese Industrial Standards). The luminous flux efficiency and Ra also decreased to such large degrees as to be 15.5 lm/W and Ra=72, respectively, at 240 mA; 14.0 lm/W and Ra=66, respectively, at 300 mA; and 12.2 lm/W and Ra=53, respectively, at 350 mA.

Comparative Example 2

A light-emitting device was produced in the following manner. Specifically, a LED emitting light having a peak at 460 nm was soldered on an 8 mm-square AlN package substrate, and was connected to electrodes by way of gold wires. The LED was then domed with transparent resin, and the dome was coated with a layer of transparent resin containing 40 wt % of a red light-emitting fluorescent substance $(Ba_{0.1}Sr_{0.8}Ca_{0.1})_2SiO_4:Eu^{2+}$ capable of giving off luminescence having a peak at 585 nm. Further, another layer of transparent resin containing 30 wt % of a green light-emitting fluorescent substance $(Ba_{0.1}Sr_{0.8})_2SiO_4:Eu^{2+}$ was formed thereon, to produce a light-emitting device having a structure according to FIG. 4. FIG. 25 shows temperature dependence of the emission intensity given by each of the green and red light-emitting fluorescent substances, provided that the intensity at room temperature is regarded as 1.0. The produced device was placed in an integrating sphere, and was then worked with 20 mA and 3.1 V. The radiated light was observed and found to have a chromaticity of (0.345, 0.352), a color temperature of 5000K, a luminous flux efficiency of 68.6 lm/W and Ra=86. FIG. 26 shows an emission spectrum of the produced device working at 20 mA drive current.

While the drive current was being increased to 350 mA, the luminance characteristics of the device were measured in the manner described above. As a result shown in FIG. 27, the chromaticity fluctuated in such a large range when the drive current was increased, as to deviate considerably from the chromaticity range regulated by JIS (Japanese Industrial Standards). The luminous flux efficiency and Ra also decreased to such large degrees as to be 43.9 lm/W and Ra=76, respectively, at 240 mA; 33.9 lm/W and Ra=68, respectively, at 300 mA; and 26.9 lm/W and Ra=57, respectively, at 350 mA.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A fluorescent substance represented by the following formula (1):

$$(M_{1-x}EC_x)_a Si_b AlO_c N_d \quad (1)$$

in which M is Sr; EC is Eu; and x, a, b, c and d are numbers satisfying the conditions of 0<x<0.4, 0.55<a<0.80, 2<b<3, 0<c≦0.6 and 4<d<5, respectively;
   in the form of crystals whose mean grain size is in the range of 20 to 100 µm and whose aspect ratio is in the range of 2 to 4; and
   emitting luminescence having a peak in the wavelength range of 580 to 660 nm under excitation by light in the wavelength range of 250 to 500 nm.

2. The fluorescent substance according to claim 1, which is in the form of crystals containing 20% or less of crystalline grains whose aspect ratio is out of the range of 2 to 4.

3. The fluorescent substance according to claim 1, wherein said x, a, b, c and d are numbers satisfying the conditions of 0.02≦x≦0.2, 0.66≦a≦0.69, 2.2≦b≦2.4, 0.43≦c≦0.51 and 4.2≦d≦4.3, respectively.

4. The fluorescent substance according to claim 1, containing a component whose XRD profile measured by use of a specific X-ray of CuKα shows diffraction peaks simultaneously at seven or more positions selected from the group consisting of eleven positions: 15.0 to 15.25°, 23.1 to 23.20°, 24.85 to 25.05°, 26.95 to 27.15°, 29.3 to 29.6°, 30.9 to 31.1°, 31.6 to 31.8°, 33.0 to 33.20°, 35.25 to 35.45°, 36.1 to 36.25°and 56.4 to 56.65°, in terms of diffraction angle (2θ).

5. The fluorescent substance according to claim 1, produced by the steps of:
   mixing materials including nitride or carbide of said M; nitride, oxide or carbide of Al; nitride, oxide or carbide of Si; and oxide, nitride or carbonate of said EC; and
   firing the mixture for a firing time of not more than 4 hours.

6. The fluorescent substance according to claim 5, wherein said firing time is in the range of not less than 0.1 hour but not more than 2 hours.

7. The fluorescent substance according to claim 5, wherein said mixture is fired at a temperature of 1500 to 2000° C. under a pressure of not less than 5 atmospheres.

8. The fluorescent substance according to claim 5, wherein said mixture is fired under nitrogen gas atmosphere.

9. A light-emitting device, comprising:
a light-emitting element (S1) giving off light in the wavelength range of 250 to 500 nm;
a fluorescent substance (R) which is represented by the following formula (1):

$$(M_{1-x}EC_x)_a Si_b AlO_c N_d \qquad (1)$$

in which M is Sr; EC is Eu; and x, a, b, c and d are numbers satisfying the conditions of 0<x<0.4, 0.55<a<0.80, 2<b<3, 0<c≦0.6 and 4<d<5, respectively; which is in the form of crystals whose mean grain size is in the range of 20 to 100 μm and whose aspect ratio is in the range of 2 to 4; and which emits luminescence having a peak in the wavelength range of 580 to 660 nm under excitation by light given off from said light-emitting element (S1);
and
another fluorescent substance (G) which is represented by the following formula (2):

$$(M'_{1-x'}EC'_{x'})_{3-y'}Al_{3+z'}Si_{13-z'}O_{2+u'}N_{21-w'} \qquad (2)$$

in which M' is Sr; EC' is Eu; and x', y', z', u' and w' are numbers satisfying the conditions of 0<x'≦1, −0.1≦y'≦0.3, −3≦z'≦1 and −3<u'−w'≦1.5, respectively; and which emits luminescence having a peak in the wavelength range of 490 to 580 nm under excitation by light given off from said light-emitting element (S1).

10. The light-emitting device according to claim 9, wherein said x', y', z', u' and w' are numbers satisfying the conditions of 0.001≦x'≦0.5, −0.09≦y'≦0.07, 0.2≦z'≦1 and −0.1<u'−w'≦0.3, respectively.

11. A light-emitting device, comprising:
a light-emitting element (S2) giving off light in the wavelength range of 250 to 430 nm;
a fluorescent substance (R) which is represented by the following formula (1):

$$(M_{1-x}EC_x)_a Si_b AlO_c N_d \qquad (1)$$

in which M is Sr; EC is Eu; and x, a, b, c and d are numbers satisfying the conditions of 0<x<0.4, 0.55<a<0.80, 2<b<3, 0<c≦0.6 and 4<d<5, respectively; which is in the form of crystals whose mean grain size is in the range of 20 to 100 μm and whose aspect ratio is in the range of 2 to 4; and which emits luminescence having a peak in the wavelength range of 580 to 660 nm under excitation by light given off from said light-emitting element (S2);
another fluorescent substance (G) which is represented by the following formula (2):

$$(M'_{1-x'}EC'_{x'})_{3-y'}Al_{3+z'}Si_{13-z'}O_{2+u'}N_{21-w'} \qquad (2)$$

in which M' is Sr; EC' is Eu; and x', y', z', u' and w' are numbers satisfying the conditions of 0<x'≦1, −0.1≦y'≦0.3, −3≦z'≦1 and −3≦u'−w'≦1.5, respectively; and which emits luminescence having a peak in the wavelength range of 490 to 580 nm under excitation by light given off from said light-emitting element (S2);
and
still another fluorescent substance (B) which emits luminescence having a peak in the wavelength range of 400 to 490 nm under excitation by light given off from said light-emitting element (S2).

12. The light-emitting device according to claim 11, wherein said fluorescent substance (B) is selected from the group consisting of $(Ba,Eu)MgAl_{10}O_{17}$, $(Sr,Ca,Ba,Eu)_{10}(PO_4)_5Cl_2$ and $(Sr,Eu)Si_9Al_{19}ON_{31}$.

13. A process for production of a fluorescent substance which is represented by the following formula (1):

$$(M_{1-x}EC_x)_a Si_b AlO_c N_d \qquad (1)$$

in which M is Sr; EC is Eu; and x, a, b, c and d are numbers satisfying the conditions of 0<x<0.4, 0.55<a<0.80, 2<b<3, 0<c≦0.6 and 4<d<5, respectively; which is in the form of crystals whose mean grain size is in the range of 20 to 100 μm and whose aspect ratio is in the range of 2 to 4; and which emits luminescence having a peak in the wavelength range of 580 to 660 nm under excitation by light in the wavelength range of 250 to 500 nm;
comprising the steps of:
mixing materials including nitride or carbide of said M; nitride, oxide or carbide of Al; nitride, oxide or carbide of Si; and oxide, nitride or carbonate of said EC; and
firing the mixture for a firing time of not more than 4 hours.

14. The process according to claim 13, wherein said firing time is in the range of not less than 0.1 hour but not more than 2 hours.

15. The process according to claim 13, wherein said mixture is fired at a temperature of 1500 to 2000° C. under a pressure of not less than 5 atmospheres.

16. The process according to claim 13, wherein said mixture is fired under nitrogen gas atmosphere.

17. The process according to claim 13, wherein the product after firing is washed with pure water or acid.

* * * * *